(12) United States Patent
Higuchi

(10) Patent No.: US 10,867,801 B2
(45) Date of Patent: Dec. 15, 2020

(54) ETCHING APPARATUS AND ETCHING METHOD

(71) Applicant: KABUSHIKI KAISHA TOSHIBA, Minato-ku (JP)

(72) Inventor: Kazuhito Higuchi, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/042,017

(22) Filed: Jul. 23, 2018

(65) Prior Publication Data

US 2019/0096687 A1 Mar. 28, 2019

(30) Foreign Application Priority Data

Sep. 26, 2017 (JP) ................................ 2017-184496

(51) Int. Cl.
| | |
|---|---|
| *H01L 21/306* | (2006.01) |
| *H01L 21/67* | (2006.01) |
| *H01L 21/78* | (2006.01) |

(52) U.S. Cl.
CPC .. *H01L 21/30604* (2013.01); *H01L 21/30612* (2013.01); *H01L 21/67075* (2013.01); *H01L 21/78* (2013.01)

(58) Field of Classification Search
CPC ......... H01L 21/30604; H01L 21/30612; H01L 21/67075; H01L 21/78
See application file for complete search history.

(56) References Cited

U.S. PATENT DOCUMENTS

| | | | | |
|---|---|---|---|---|
| 5,908,510 | A | * | 6/1999 | McCullough ......... B08B 7/0021 134/2 |
| 9,620,410 | B1 | | 4/2017 | Wagner et al. |
| 10,297,475 | B2 | * | 5/2019 | Yamauchi ......... H01L 21/02019 |
| 2004/0003828 | A1 | * | 1/2004 | Jackson ............ H01L 21/76814 134/1 |
| 2009/0071933 | A1 | * | 3/2009 | Floyd ................ H01L 21/32135 216/13 |
| 2010/0330777 | A1 | * | 12/2010 | Hanaoka ........... H01L 21/02032 438/458 |
| 2011/0266521 | A1 | | 11/2011 | Ferrari et al. |
| 2016/0079078 | A1 | | 3/2016 | Asano |
| 2016/0273121 | A1 | | 9/2016 | Higuchi et al. |
| 2017/0062230 | A1 | | 3/2017 | Matsuo et al. |
| 2017/0068219 | A1 | | 3/2017 | Dubois |
| 2017/0073830 | A1 | | 3/2017 | Higuchi |

(Continued)

FOREIGN PATENT DOCUMENTS

| | | |
|---|---|---|
| JP | 2011-101009 | 5/2011 |
| JP | 2012-516035 | 7/2012 |

(Continued)

*Primary Examiner* — Zandra V Smith
*Assistant Examiner* — Andre C Stevenson
(74) *Attorney, Agent, or Firm* — Oblon, McClelland, Maier & Neustadt, L.L.P.

(57) ABSTRACT

According to one embodiment, an etching apparatus for etching a semiconductor with an aid of a noble metal catalyst, includes a reaction vessel configured to accommodate a semiconductor substrate provided with a catalyst layer including a noble metal, and a feeder configured to feed, to the reaction vessel, an oxidizer, hydrogen fluoride, an organic additive, and carbon dioxide in a supercritical or subcritical state.

20 Claims, 6 Drawing Sheets

(56) References Cited

U.S. PATENT DOCUMENTS

| | | | |
|---|---|---|---|
| 2017/0267531 A1* | 9/2017 | Haukka | C23C 16/26 |
| 2018/0033634 A1* | 2/2018 | Matsuo | B01J 23/50 |
| 2018/0073160 A1 | 3/2018 | Higuchi | |

FOREIGN PATENT DOCUMENTS

| | | |
|---|---|---|
| JP | 2013-527103 | 6/2013 |
| JP | 2016-058647 | 4/2016 |
| JP | 2016-176088 | 10/2016 |
| JP | 2017-050378 | 3/2017 |
| JP | 2017-053008 | 3/2017 |
| JP | 2017-053855 | 3/2017 |
| JP | 2018-040048 | 3/2018 |

* cited by examiner

5μm

5μm

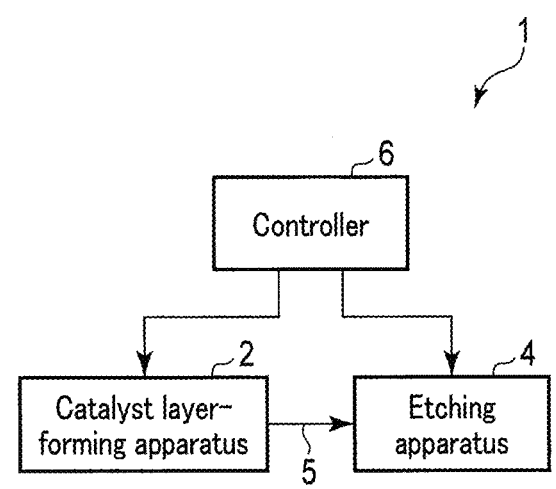
F I G. 9

ETCHING APPARATUS AND ETCHING METHOD

CROSS-REFERENCE TO RELATED APPLICATION

This application is based upon and claims the benefit of priority from Japanese Patent Application No. 2017-184496, filed Sep. 26, 2017, the entire contents of which are incorporated herein by reference.

FIELD

Embodiments described herein relate generally to an etching apparatus and method, a processing system, and a method of manufacturing an article, semiconductor device and semiconductor chip.

BACKGROUND

The Metal-Assisted Chemical Etching (hereinafter referred to as MacEtch) method is a method of etching a semiconductor surface using a noble metal as a catalyst. According to the MacEtch method, for example, it is possible to form a recessed portion having a high aspect ratio on a semiconductor substrate.

BRIEF DESCRIPTION OF THE DRAWINGS

FIG. 9 is a block diagram showing a processing system according to the embodiment.

DETAILED DESCRIPTION

Figure 1:
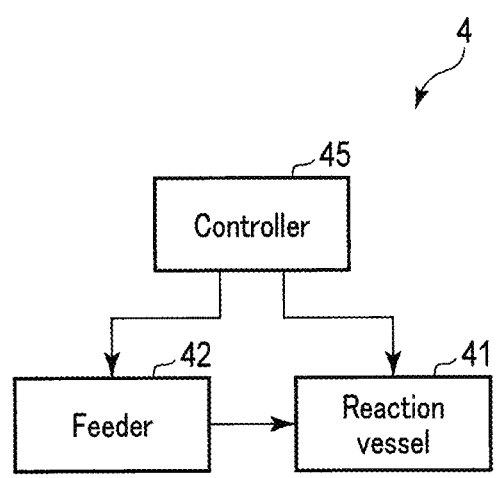
FIG. 1 is a block diagram showing an etching apparatus according to an embodiment.

An etching apparatus according to a first aspect is an etching apparatus for etching a semiconductor with an aid of a noble metal catalyst and comprises a reaction vessel configured to accommodate a semiconductor substrate provided with a catalyst layer including a noble metal, and a feeder configured to feed, to the reaction vessel, an oxidizer, hydrogen fluoride, an organic additive, and carbon dioxide in a supercritical or subcritical state.

A processing system according to a second aspect comprises the etching apparatus according to the first aspect, a catalyst layer-forming apparatus configured to form a catalyst layer including a noble metal on a semiconductor substrate, and a conveyor configured to convey the semiconductor substrate on which the catalyst layer is formed, from the catalyst layer-forming apparatus to the etching apparatus.

An etching method according to a third aspect is an etching method of etching a semiconductor with an aid of a noble metal catalyst and comprises etching a semiconductor structure provided with a catalyst layer including a noble metal in a fluid containing an oxidizer, hydrogen fluoride, an organic additive, and carbon dioxide in a supercritical or subcritical state.

An article manufacturing method according to a fourth aspect comprises etching the semiconductor structure by the etching method according to the third aspect.

A semiconductor device manufacturing method according to a fifth aspect comprises etching a semiconductor substrate by the etching method according to the third aspect.

A semiconductor chip manufacturing method according to a sixth aspect comprises singulating a semiconductor substrate into semiconductor chips by the etching method according to the third aspect.

Embodiments will be described in detail below with reference to the accompanying drawings. Note that the same reference numerals denote constituent elements which achieve the same or similar functions throughout all the drawings, and a repetitive explanation will be omitted.

<Etching Apparatus>

First, an etching apparatus according to an embodiment will be described.

Figure 2:
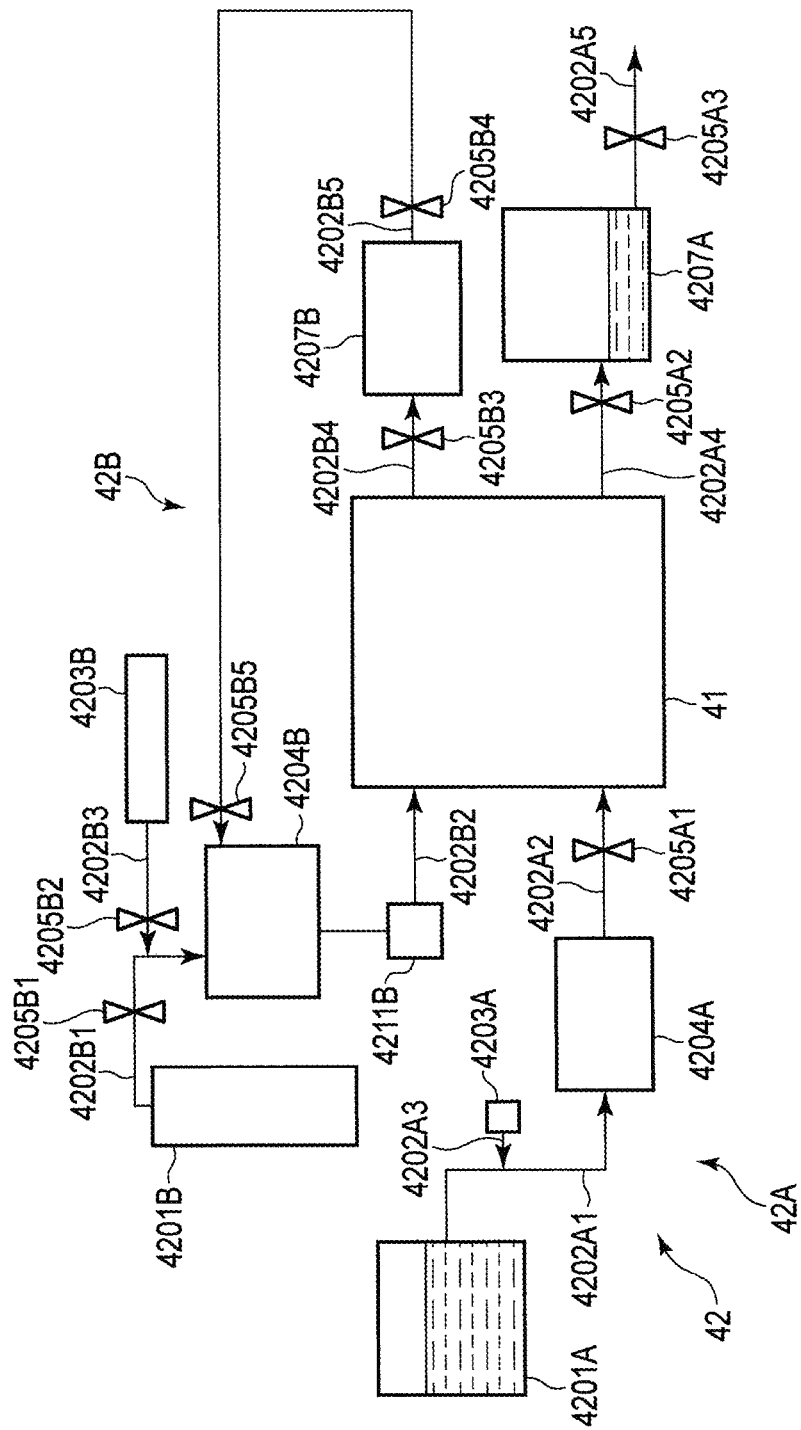
FIG. 2 is a block diagram showing a part of the etching apparatus shown in FIG. 1.

FIG. 1 is a block diagram showing an etching apparatus according to an embodiment. FIG. 2 is a block diagram showing a part of the etching apparatus shown in FIG. 1.

An etching apparatus 4 shown in FIG. 1 is used for etching a semiconductor structure such as a semiconductor substrate. The etching apparatus 4 can be used in the manufacture of articles such as a semiconductor device. As an example, the etching apparatus 4 can be used in the manufacture of semiconductor chips, including singulating a semiconductor substrate into semiconductor chips.

The etching apparatus 4 shown in FIG. 1 includes a reaction vessel 41, a feeder 42, and a controller 45.

The reaction vessel 41 includes a vessel body as a pressure vessel. The vessel body is, for example, a stainless steel vessel in which an inner surface is covered with a material having etching resistance.

The vessel body includes one or more loading/unloading ports for loading/unloading the semiconductor substrate provided with a catalyst layer made of a noble metal. The vessel body further includes first and second inlets, and first and second outlets. The semiconductor substrate provided with the catalyst layer will be described in detail later.

The reaction vessel 41 further includes an agitator (now shown) to agitate a fluid stored in the vessel body. The agitator may be omitted.

The feeder 42 includes a first feeder 42A and a second feeder 42B.

The first feeder 42A is an etchant feeder to feed, to the reaction vessel 41, an oxidizer, hydrogen fluoride, and an organic additive. The first feeder 42A includes vessels 4201A, 4203A, and 4207A, conduits 4202A1 to 4202A5, a pump 4204A, and valves 4205A1 to 4205A3.

The vessel 4201A stores the etchant. The etchant contains the oxidizer and hydrogen fluoride. The vessel 4201A includes an outlet for discharging the etchant. The composition of the etchant will be described in detail later.

One end of the conduit 4202A1 is connected to the outlet of the vessel 4201A. The other end of the conduit 4202A1 is connected to the inlet of the pump 4204A. The conduit 4202A1 guides the etchant from the vessel 4201A to the pump 4204A. The conduit 4202A1 may be provided with a valve to switch feeding and non-feeding of the etchant to the pump 4204A from the vessel 4201A.

The vessel 4203A stores the organic additive. The vessel 4203A includes an outlet for discharging the organic additive. The organic additive is, for example, a polar molecule. Note that in this embodiment, the organic additive is a surfactant as an example.

One end of the conduit 4202A3 is connected to the outlet of the vessel 4203A. The other end of the conduit 4202A3 is connected to the inlet of the pump 4204A or the conduit 4202A1. The conduit 4202A3 guides the surfactant from the vessel 4203A to the pump 4204A. The conduit 4202A3 may be provided with a valve to switch feeding and non-feeding of the surfactant to the pump 4204A from the vessel 4203A.

The pump 4204A applies pressure to the etchant fed from the vessel 4201A and the surfactant fed from the vessel 4203A and discharges them.

One end of the conduit 4202A2 is connected to the outlet of the pump 4204A. The other end of the conduit 4202A2 is connected to the first inlet of the vessel body. The conduit 4202A2 guides a mixture of the etchant and the surfactant from the pump 4204A to the vessel body.

The valve 4205A1 is provided in the conduit 4202A2. The valve 4205A1 switches feeding and non-feeding of the mixture of the etchant and the surfactant to the vessel body from the pump 4204A.

One end of the conduit 4202A4 is connected to the first outlet of the vessel body. The other end of the conduit 4202A4 is connected to the inlet of the vessel 4207A. The conduit 4202A4 guides the mixture of the etchant and the surfactant from the vessel body to the vessel 4207A.

The valve 4205A2 is provided in the conduit 4202A4. The valve 4205A2 switches feeding and non-feeding of the mixture of the etchant and the surfactant to the vessel 4207A from the vessel body.

The vessel 4207A temporarily stores the mixture of the etchant and the surfactant. The vessel 4207A includes an outlet for discharging the mixture.

One end of the conduit 4202A5 is connected to the outlet of the vessel 4207A. The other end of the conduit 4202A5 is connected to the inlet of the pump 4204A or the conduit 4202A1. The conduit 4202A5 guides the used etchant from the vessel 4207A to the pump 4204A. A replenish unit may be attached to the conduit 4202A5 to replenish the mixture flowing therein with at least one of the oxidizer and hydrogen fluoride.

The valve 4205A3 is provided in the conduit 4202A5. The valve 4205A3 switches feeding and non-feeding of the mixture of the etchant and the surfactant to the inlet of the pump 4204A or the conduit 4202A1 from the vessel 4207A.

The second feeder 42B is a carbon dioxide feeder configured to feed carbon dioxide in a supercritical or subcritical state to the reaction vessel 41. Note that in this embodiment, the second feeder 42B feeds carbon dioxide in a supercritical state to the reaction vessel 41.

The second feeder 42B includes vessels 4201B, 4203B and 4207B, conduits 4202B1 to 4202B4, a pump 4204B, valves 4205B1 to 4205B5, and a heating unit 4211B.

The vessel 4201B stores carbon dioxide. The vessel 4201B includes an outlet for discharging carbon dioxide.

One end of the conduit 4202B1 is connected to the outlet of the vessel 4201B. The other end of the conduit 4202B1 is connected to the inlet of the pump 4204B. The conduit 4202B1 guides carbon dioxide from the vessel 4201B to the pump 4204B.

The valve 4205B1 is provided in the conduit 4202B1. The valve 4205B1 switches feeding and non-feeding of carbon dioxide to the pump 4204B from the vessel 4201B.

The vessel 4203B stores a rinse liquid. The rinse liquid is, for example, a lower alcohol such as ethanol and isopropanol. The vessel 4203B includes an outlet for discharging the rinse liquid.

One end of the conduit 4202B3 is connected to the outlet of the vessel 4203B. The other end of the conduit 4202B3 is connected to the inlet of the pump 4204B or the conduit 4202B1. The conduit 4202B3 guides the rinse liquid from the vessel 4203B to the pump 4204B.

The valve 4205B2 is provided in the conduit 4202B3. The valve 4205B2 switches feeding and non-feeding of the rinse liquid to the pump 4204B from the vessel 4203B.

A configuration capable of further feeding a surfactant at the time of feeding the rinse liquid may be employed. For example, there may be further provided a vessel in which the surfactant is stored, a conduit connected between the outlet of the vessel and the inlet of the pump 4204B, and a valve provided in this conduit.

The pump 4204B applies pressure to carbon dioxide fed from the vessel 4201B at the supercritical pressure (7.37 MPa) or more, e.g., 10 MPa, and discharges it. Furthermore, the pump 4204B applies pressure to the rinse liquid fed from the vessel 4203B and discharges it.

One end of the conduit 4202B2 is connected to the outlet of the pump 4204B. The other end of the conduit 4202B2 is connected to the second inlet of the vessel body. The conduit 4202B2 guides carbon dioxide or the rinse liquid from the pump 4204B to the vessel body.

The heating unit 4211E is provided on the conduit 4202B2. The heating unit 4211B, for example, heats carbon dioxide in the conduit 4202B2 to its critical temperature (31.1° C.) or more.

One end of the conduit 4202B4 is connected to the second outlet of the vessel body. The other end of the conduit 4202B4 is connected to the inlet of the vessel 4207B. The conduit 420284 guides used carbon dioxide, which has been liquefied or vaporized, from the vessel body to the vessel 4207B.

The valve 4205B3 is provided in the conduit 4202B4. The valve 4205B3 switches feeding and non-feeding of carbon dioxide to the vessel 4207B from the vessel body.

The vessel 4207B temporarily stores used carbon dioxide. The vessel 4207B includes an outlet for discharging this carbon dioxide.

One end of the conduit 4202B5 is connected to the outlet of the vessel 4207B. The other end of the conduit 4202B5 is connected to the inlet of the pump 4204B. The conduit 4202B5 guides used carbon dioxide from the vessel 4207B to the pump 4204B.

The valves 4205B4 and 4205B5 are provided in the conduit 4202B5. The valves 4205B4 and 4205B5 switch feeding and non-feeding of carbon dioxide to the pump 42048 from the vessel 4207B.

The controller 45 is connected to the reaction vessel 41 and the feeder 42. The controller 45, for example, controls various operations in the reaction vessel 41, e.g., the open/close operation of the loading/unloading port and the operation of the agitator. Furthermore, the controller 45 controls various operations in the feeder 42, e.g., the open/close operations of the valves 4205A1 to 4205A3 and 4205B1 to 4205B5, the operations of the pumps 4204A and 4204B, and the operation of the heating unit 4211B. Moreover, the controller 45 controls the operation of the conveyor (not shown) that loads, into the vessel body, the semiconductor substrate provided with the catalyst layer made of a noble metal, and unloads the semiconductor substrate from the vessel body.

Etching by the etching apparatus 4 is performed by, for example, the method described below.

First, the controller 45 controls the operation of the reaction vessel 41 to open the loading/unloading port of the vessel body. Next, the controller 45 controls the operation of the conveyor to load the object to be processed into the vessel body. After that, the controller 45 controls the operation of the reaction vessel 41 to close the loading/unloading port of the vessel body.

Figure 3:
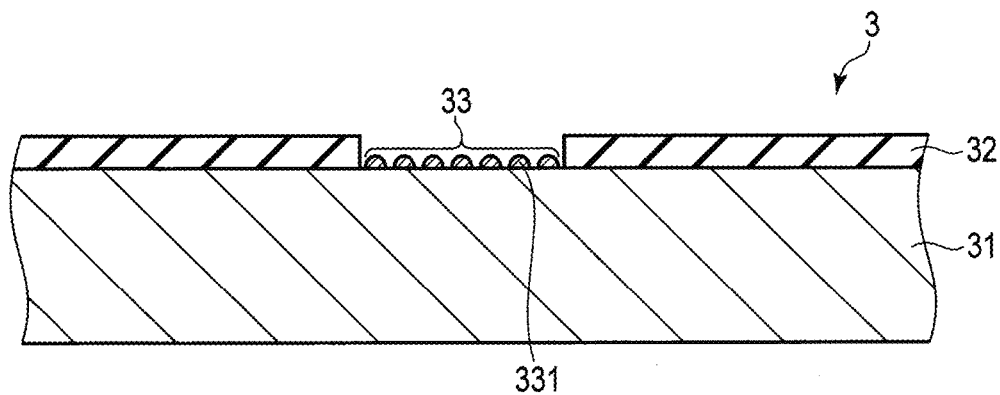
FIG. 3 is a sectional view schematically showing an example of an object to be processed.

FIG. 3 is a sectional view schematically showing an example of the object to be processed.

The to-be-processed object 3 shown in FIG. 3 includes a semiconductor substrate 31. The semiconductor substrate 31 is made of a semiconductor. The semiconductor is, for example, a material selected from silicon (Si), germanium (Ge), a semiconductor made of a compound containing group III and group V elements such as gallium arsenide (GaAs) and gallium nitride (GaN), and silicon carbide (SiC). According to an example, the semiconductor substrate 31 includes silicon. Note that a term "group" used herein is a "group" of a short-form periodic table.

The semiconductor substrate 31 may be doped with an impurity or have semiconductor elements such as transistors or diodes formed on or in it. The main surface of the semiconductor substrate 31 may be parallel to any crystal plane of the semiconductor.

A mask layer 32 is provided on one main surface of the semiconductor substrate 31. The mask layer 32 partially covers the main surface of the semiconductor substrate 31. The mask layer 32 prevents the portion of the main surface of the semiconductor substrate 31 that is not covered with the mask layer 32 from coming into contact with the noble metal.

Examples of the material of the mask layer 32 include organic materials such as polyimide, a fluorine resin, a phenolic resin, an acrylic resin, and a novolak resin, and inorganic materials such as silicon oxide and silicon nitride.

The mask layer 32 can be formed by, for example, existing semiconductor processes. The mask layer 32 made of an organic material can be formed by, for example, photolithography. The mask layer 32 made of an inorganic material can be formed by, for example, deposition of an inorganic material layer by a vapor deposition method, formation of a mask by photolithography, and patterning of an inorganic material layer by etching. Alternatively, the mask layer 32 made of an inorganic material can be formed by oxidation or nitriding of the surface region of the semiconductor substrate 31, mask formation by photolithography, and patterning of an oxide or a nitride layer by etching. The mask layer 32 can be omitted.

A catalyst layer 33 is provided on the portion of the main surface of the semiconductor substrate 31 that is not covered with the mask layer 32. The catalyst layer 33 is, for example, a discontinuous layer including a noble metal. Note that in this embodiment, the catalyst layer 33 is a particulate layer formed of noble metal particles 331 as an example.

The noble metal is, for example, one or more of gold (Au), silver (Ag), platinum (Pt), rhodium (Rh), palladium (Pd), and ruthenium (Ru). The catalyst layer 33 may further include a metal other than the noble metal such as titanium (Ti).

Next, the controller 45 controls operations of the reaction vessel 41 and the feeder 42 in the following manner.

First, the pump 4204A is driven, and the valve 4205A1 is opened. At this time, the valves 4205A2, 4205A3 and 4205B1 to 4205B5 are closed. In this manner, the etchant is fed into the vessel body. After a predetermined amount of the etchant is fed into the vessel body, the pump 4204A is stopped, and the valve 4205A1 is closed.

The etchant contains an oxidizer and hydrogen fluoride.

The oxidizer can be selected from, for example, hydrogen peroxide, nitric acid, $AgNO_3$, $KAuCl_4$, $HAuCl_4$, $K_2PtCl_6$, $H_2PtCl_6$, $Fe(NO_3)_3$, $Ni(NO_3)_2$, $mg(NO_3)_2$, $Na_2S_2O_8$, $K_2S_2O_8$, $KMnO_4$, and $K_2Cr_2O_7$. Hydrogen peroxide is preferable as the oxidizer because no harmful byproduct is produced and a semiconductor element is not contaminated.

The etchant may further contain a buffer. The buffer contains, for example, at least one of ammonium fluoride and ammonia. As an example, the buffer is ammonium fluoride. As another example, the buffer is a mixture of ammonium fluoride and ammonia.

The etchant may further contain other components such as water.

Next, the valve 4205B1 is opened, the pump 4204B is driven, and the heating unit 4211B is energized. Thereby, carbon dioxide as a supercritical fluid (hereinafter referred to as supercritical carbon dioxide) is fed into the vessel body. After a predetermined amount of carbon dioxide is fed into the vessel body, the pump 4204B is stopped, and the valve 4205B1 is closed.

Supercritical carbon dioxide fed into the vessel body is quickly mixed with the etchant and the surfactant. Consequently, a disperse system is generated in the vessel body, in which a dispersion medium is made of the etchant and the surfactant and a disperse phase contains supercritical carbon dioxide.

The surfactant is interposed between the particle made of supercritical carbon dioxide and the continuous phase made of the etchant. That is, the surfactant forms micelles in the etchant, and supercritical carbon dioxide is incorporated in these micelles.

The etchant is fed from the disperse system to the portions of the semiconductor substrate 31 that are in contact with the noble metal particles 331. Thus, at these portions, etching of the semiconductor progresses with the aid of the noble metal catalyst.

After a predetermined time has elapsed from the start of feeding of supercritical carbon dioxide into the vessel body, the valve 4205A2 is opened. Thereby, the pressure in the vessel body decreases, and carbon dioxide changes from the supercritical fluid to gas. Consequently, carbon dioxide, the etchant, and the surfactant are phase-separated in the vessel body. The etchant and the surfactant in the vessel body are discharged from the first outlet of the vessel body. The etchant and the surfactant discharged from the first outlet are guided to the vessel 4207A through the conduit 4202A4, and are stored therein.

Thereafter, the valve 4205A2 is closed, and the valve 4205B2 is opened. Thereby, supercritical carbon dioxide and the rinse liquid are fed into the vessel body. At this time, a surfactant may be further fed into the vessel body. If the surfactant is further fed, the same disperse system as described above is generated in the vessel body except that the rinse liquid is used instead of the etchant.

After a predetermined time has elapsed from the start of feeding of the rinse liquid in the vessel body, the valve 4205B2, etc. are closed to stop the feeding of the rinse liquid and the surfactant into the vessel body. Furthermore, the valve 4205B3 is opened to decrease the pressure in the vessel body. Thereby, the etchant and the like remaining in the vessel body are discharged from the second outlet of the vessel body together with the rinse liquid and carbon dioxide. The rinse liquid, carbon dioxide, the etchant, and the like discharged from the second outlet are guided to the vessel 4207B through the conduit 4202B4, and are stored therein.

Next, the valve 4205B1 is closed, the pump 4204B is stopped, and energization of the heating unit 4211B is stopped. Thereby, the feeding of supercritical carbon dioxide in the vessel body is stopped, and carbon dioxide is discharged from the vessel body. After that, the valve 4205B3 is closed.

Next, the controller 45 controls the operation of the reaction vessel 41 to open the loading/unloading port of the vessel body. Next, the controller 45 controls the operation of the conveyor to unload the to-be-processed object 3 after etching from the vessel body.

The controller 45 controls the open/close operation of the valve 4205A3 so that the mixture of the etchant and the surfactant stored in the vessel 4207A is used in the subsequent etching process. Moreover, the controller 45 controls the open/close operations of the valves 4205B4 and 4205B5 so that carbon dioxide stored in the vessel 4207B is used in the subsequent etching process.

According to the apparatus and method described above, it is possible to form, at a high etching rate, a recessed portion whose depth direction is perpendicular to the semiconductor surface. This will be explained below.

Figure 4:
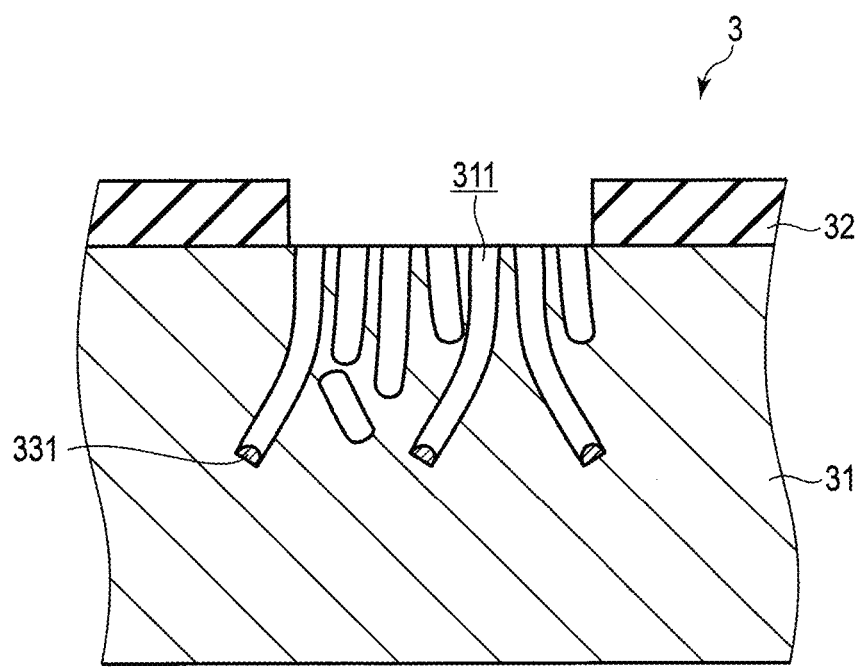
FIG. 4 is a sectional view schematically showing an example of a structure obtained when etching is performed by a method according to a comparative example.
Figure 5:
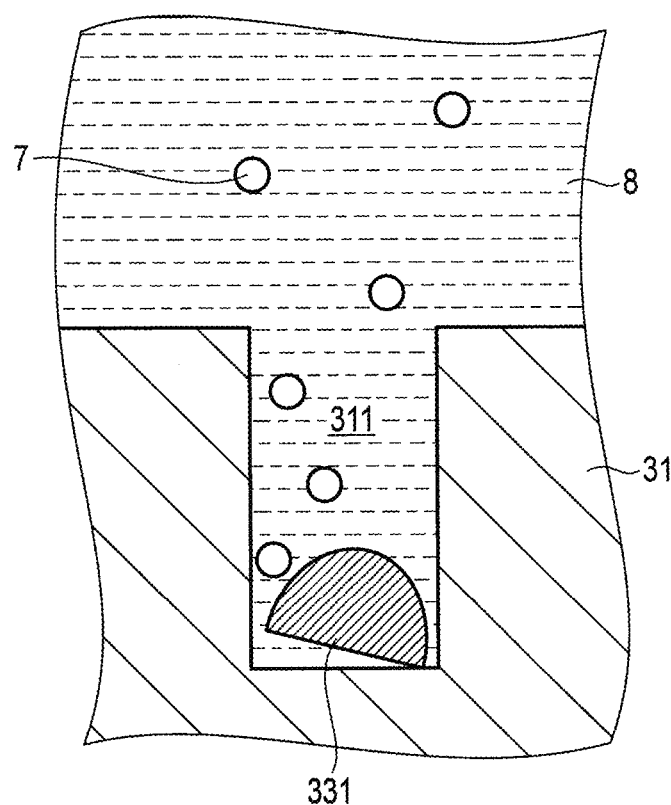
FIG. 5 is a sectional view schematically showing an example of a phenomenon that may occur when etching is performed by the method according to the comparative example.
Figure 6:
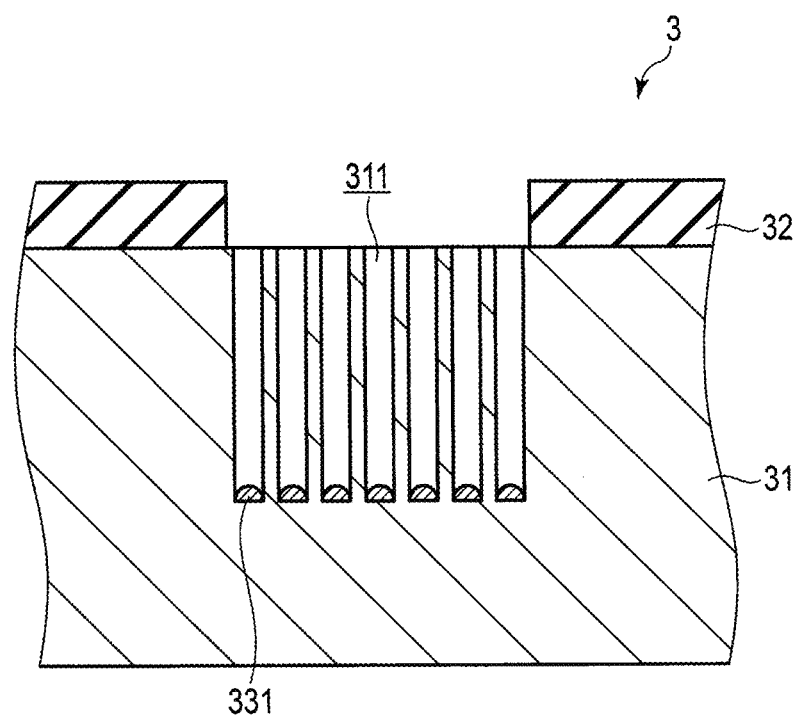
FIG. 6 is a sectional view schematically showing an example of a structure obtained when etching is performed using the apparatus shown in FIG. 1 and FIG. 2.

FIG. 4 is a sectional view schematically showing an example of a structure obtained when etching is performed by a method according to a comparative example. FIG. 5 is a sectional view schematically showing an example of a phenomenon that may occur when etching is performed by the method according to the comparative example. FIG. 6 is a sectional view schematically showing an example of a structure obtained when etching is performed using the apparatus shown in FIG. 1 and FIG. 2.

When the to-be-processed object 3 is subject to the etching process using only the aforementioned etchant, if etching conditions are set to achieve a high etching rate, there is a case where holes 311 are curved and do not extend in a direction perpendicular to the main surface of the semiconductor substrate 31 as shown in FIG. 4. Furthermore, even if etching conditions are set to achieve a high etching rate, when deep holes 311 are formed, as the depth of the holes 311 increases, e.g., if the aspect ratio, which is the ratio of the depth with respect to the opening width of the holes 311, is approximately 100 or more, an etching rate decreases. It is considered that this is because of the following reasons.

If the oxidizer oxidizes the portion of the surface of the semiconductor substrate 31 that is in contact with the noble metal particles 331, and the oxide thus produced is dissolved by hydrofluoric acid, hydrogen may be generated. If the etching conditions are set to achieve a high etching rate, hydrogen forms relatively large bubbles 7 which move upward in the etchant 8 as shown in FIG. 5. These bubbles 7 change the contact state of the noble metal particle 331 and the semiconductor substrate 31. For example, the bubbles 7 incline the bottom surface of the noble metal particle 331 with respect to the main surface of the semiconductor substrate 31. Consequently, the holes 311 are curved and do not extend in a direction perpendicular to the main surface of the semiconductor substrate 31.

Furthermore, when the depth of the holes 311 increases, e.g., if the aspect ratio, which is the ratio of the depth with respect to the opening width of the holes 311, reaches approximately 100 or more, the feeding of the etchant into the bottom portions of the holes 311 and the discharge of the dissolved product become insufficient. As a result, the etching rate decreases.

In contrast, according to the apparatus and method described with reference to FIG. 1, FIG. 2, etc., etching is performed under high pressure conditions. In addition, according to the apparatus and method, supercritical carbon dioxide is used. Hydrogen is easily dissolved into supercritical carbon dioxide. Thus, in the apparatus and method described with reference to FIG. 1, FIG. 2, etc., the bubbles 7 of hydrogen are less likely formed. Accordingly, the holes 311 extend in a direction perpendicular to the main surface of the semiconductor substrate 31 as shown in FIG. 5. That is, it is possible to obtain the holes 311 excellent in linearity. Note that adjacent holes 311 may be spaced apart from each other, or may be connected to each other.

Furthermore, supercritical carbon dioxide has an extremely low viscosity and surface tension. Hence, the size of the micelles containing supercritical carbon dioxide in the surfactant is extremely small, these micelles rapidly move between the bottom portions of the holes 311 and the outside of the holes 311, and its agitation effect can promote the movement of the etchant and the dissolved product. Thus, according to the apparatus and method described with reference to FIG. 1, FIG. 2, etc., it is possible to achieve a high etching rate, and even when the depth of the holes 311 increases, the etching rate less likely decreases.

Therefore, according to the apparatus and method described with reference to FIG. 1, FIG. 2, etc., it is possible to form, at a high etching rate, the holes 311 whose depth direction is perpendicular to the semiconductor surface.

Furthermore, according to the apparatus and method described with reference to FIG. 1, FIG. 2, etc., cleaning and drying using supercritical carbon dioxide are performed subsequent to the etching using supercritical carbon dioxide. Thus, according to the apparatus and method, the pillar portions each surrounded by the adjacent holes 311 of the semiconductor substrate 31 less likely collapse due to the surface tension.

Besides, the apparatus described with reference to FIG. 1, FIG. 2, etc. performs a plurality of processes in the single reaction vessel 41. Thus, it is possible to install the apparatus in a relatively small space and to install the apparatus with a relatively low facility cost.

Moreover, according to the apparatus and method described with reference to FIG. 1, FIG. 2, etc., used carbon dioxide, etchant, etc. are reused. Thus, running costs can be relatively low.

It can be assumed that the phenomenon explained with reference to FIG. 5 is correct from the test results described below.

Figure 7:
FIG. 7 is a micrograph showing a cross-section of a semiconductor substrate that is etched under conditions where hydrogen is less likely generated.
Figure 8:
FIG. 8 is a micrograph showing a cross-section of a semiconductor substrate that is etched under conditions where hydrogen is likely generated.

FIG. 7 is a micrograph showing a cross-section of a semiconductor substrate that is etched under conditions where hydrogen is less likely generated. FIG. 8 is a micrograph showing a cross-section of a semiconductor substrate that is etched under conditions where hydrogen is likely generated.

The structure shown in FIG. 7 was obtained by etching the silicon substrate in which the noble metal catalyst layer was formed on the surface, using only the etchant containing hydrogen fluoride and hydrogen peroxide at a molar ratio of 1:5. In this etching, the amount of hydrogen gas generated was $3.3 \times 10^{-5}$ mol, and a high linearity was achieved, as shown in FIG. 7. However, in this etching, the amount of dissolved silicon was $3.8 \times 10^{-1}$ mol, and a high etching rate was not achieved.

On the other hand, the structure shown in FIG. 8 was obtained by etching the silicon substrate in which the noble metal catalyst layer was formed on the surface, using only the etchant containing hydrogen fluoride and hydrogen peroxide at a molar ratio of 10:5. In this etching, the amount of dissolved silicon was $2.1 \times 10^{-3}$ mol, and a high etching rate was achieved. However, in this etching, the amount of hydrogen gas generated was $6.8 \times 10^{-4}$ mol, and a high linearity was not achieved, as shown in FIG. 8.

From these test results, it can be assumed that in the etching using no supercritical carbon dioxide, the etching rate and the linearity are in a trade-off relationship, and the linearity is related to the amount of hydrogen generated.

<Processing System>

Next, a processing system will be described.

FIG. 9 is a block diagram showing the processing system according to the embodiment.

A processing system 1 shown in FIG. 9 includes a catalyst layer-forming apparatus 2, an etching apparatus 4, a conveyor 5, and a controller 6.

The catalyst layer-forming apparatus 2 forms a catalyst layer including a noble metal on a semiconductor substrate. The catalyst layer-forming apparatus 2 is, for example, a plating apparatus, or a vapor deposition apparatus such as an evaporation apparatus and a sputtering apparatus. As an example, the catalyst layer-forming apparatus 2 forms the catalyst layer 33 of the to-be-processed object 3 described with reference to FIG. 3.

The etching apparatus 4 is, for example, the etching apparatus described with reference to FIG. 1, FIG. 2, etc.

The conveyor 5 conveys the semiconductor substrate on which the catalyst layer is formed, from the catalyst layer-forming apparatus 2 to the etching apparatus 4.

The controller 6 is connected to the catalyst layer-forming apparatus 2, the etching apparatus 4, and the conveyor 5. The controller 6 controls the operations of the catalyst layer-forming apparatus 2, the etching apparatus 4, and the conveyor 5. Note that the controller 45 shown in FIG. 1 may be omitted and the controller 6 may play a role thereof.

The processing system 1 exhibits the effects described for the etching apparatus.

In the embodiment described above, carbon dioxide is in a supercritical state, but carbon dioxide may be in a subcritical state. As an example, carbon dioxide in a supercritical or subcritical state has a pressure of approximately 8 to 10 MPa and a temperature of approximately 50° C.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Inventions relating to the above-described embodiments will be summarized as follows.

[1] An etching apparatus for etching a semiconductor with an aid of a noble metal catalyst, comprising:

a reaction vessel configured to accommodate a semiconductor substrate provided with a catalyst layer including a noble metal; and a feeder configured to feed, to the reaction vessel, an oxidizer, hydrogen fluoride, an organic additive, and carbon dioxide in a supercritical or subcritical state.

[2] The etching apparatus according to item [1], wherein the feeder comprises:

an etchant feeder configured to feed the oxidizer, hydrogen fluoride, and the organic additive to the reaction vessel; and a carbon dioxide feeder configured to feed carbon dioxide in the supercritical or subcritical state to the reaction vessel.

[3] A processing system comprising:

the etching apparatus according to item [1];

a catalyst layer-forming apparatus configured to form a catalyst layer including a noble metal on a semiconductor substrate; and a conveyor configured to convey the semiconductor substrate on which the catalyst layer is formed, from the catalyst layer-forming apparatus to the etching apparatus.

[4] The processing system according to item [3], wherein the feeder comprises:

an etchant feeder configured to feed the oxidizer, hydrogen fluoride, and the organic additive to the reaction vessel; and a carbon dioxide feeder configured to feed carbon dioxide in the supercritical or subcritical state to the reaction vessel.

[5] An etching method of etching a semiconductor with an aid of a noble metal catalyst, comprising:

etching a semiconductor structure provided with a catalyst layer including a noble metal in a fluid containing an oxidizer, hydrogen fluoride, an organic additive, and carbon dioxide in a supercritical or subcritical state.

[6] The etching method according to item [5], wherein the organic additive is a polar molecule.

[7] The etching method according to item [6], further comprising allowing the organic additive to form, in the fluid, micelles containing carbon dioxide in the supercritical or subcritical state.

[8] The etching method according to item [5], wherein the organic additive is a surfactant.

[9] The etching method according to item [8], further comprising allowing the organic additive to form, in the fluid, micelles containing carbon dioxide in the supercritical or subcritical state.

[10] The etching method according to item [5], further comprising allowing the organic additive to form, in the fluid, micelles containing carbon dioxide in the supercritical or subcritical state.

[11] The etching method according to item [5], further comprising forming the catalyst layer on the semiconductor structure.

[12] An article manufacturing method, comprising etching the semiconductor structure by the etching method according to item [5].

[13] The article manufacturing method according to item [12], wherein the organic additive is a surfactant.

The article manufacturing method according to item [12], further comprising allowing the organic additive to form, in the fluid, micelles containing carbon dioxide in the supercritical or subcritical state.

[15] A semiconductor device manufacturing method, comprising etching a semiconductor substrate by the etching method according to item [5].

[16] The semiconductor device manufacturing method according to item [15], wherein the organic additive is a surfactant.

The semiconductor device manufacturing method according to item [15], further comprising allowing the organic additive to form, in the fluid, micelles containing carbon dioxide in the supercritical or subcritical state.

[18] A semiconductor chip manufacturing method, comprising singulating a semiconductor substrate into semiconductor chips by the etching method according to item [5].

[19] The semiconductor chip manufacturing method according to item [18], wherein the organic additive is a surfactant.

[20] The semiconductor chip manufacturing method according to item [18], further comprising allowing the organic additive to form, in the fluid, micelles containing carbon dioxide in the supercritical or subcritical state.

The invention claimed is:

1. An etching apparatus for etching a semiconductor with an aid of a noble metal catalyst, the etching apparatus comprising:
    a reaction vessel configured to accommodate a semiconductor substrate provided with a catalyst layer including a noble metal;
    a first feeder configured to feed, to the reaction vessel, an oxidizer, hydrogen fluoride, and an organic additive; and
    a second feeder comprising a heating unit and a pump and configured to feed, to the reaction vessel, carbon dioxide in a supercritical state.

2. The etching apparatus according to claim 1, wherein the oxidizer is hydrogen peroxide, and the hydrogen fluoride and the hydrogen peroxide are at a molar ratio of 1:5.

3. A processing system comprising:
    the etching apparatus according to claim 1;
    a catalyst layer-forming apparatus configured to form a catalyst layer including a noble metal on a semiconductor substrate; and
    a conveyor configured to convey the semiconductor substrate on which the catalyst layer is formed, from the catalyst layer-forming apparatus to the etching apparatus.

4. The processing system according to claim 3, wherein the second feeder
    is further configured to feed carbon dioxide in a supercritical or a subcritical state to the reaction vessel.

5. An etching method of etching a semiconductor with an aid of a noble metal catalyst, the etching method comprising:
    accommodating, by a reaction vessel, a semiconductor substrate provided with a catalyst layer;
    feeding, by a first feeder, to the reaction vessel, an oxidizer, hydrogen fluoride, an organic additive;
    feeding, by a second feeder, to the reaction vessel, carbon dioxide;
    closing, by a controller, a plurality of first valves of the first feeder and open a second valve of the second feeder; and
    etching a semiconductor structure provided with the catalyst layer including a noble metal in a fluid containing the oxidizer, the hydrogen fluoride, the organic additive, and the carbon dioxide in a supercritical or subcritical state.

6. The etching method according to claim 5, wherein the organic additive is a polar molecule.

7. The etching method according to claim 6, further comprising using hydrogen peroxide as the oxidizer, wherein the hydrogen fluoride and the hydrogen peroxide are at a molar ratio of 1:5.

8. The etching method according to claim 5, wherein the organic additive is a surfactant.

9. The etching method according to claim 8, further comprising allowing the organic additive to form, in the fluid, micelles containing carbon dioxide in a supercritical or a subcritical state.

10. The etching method according to claim 5, further comprising allowing the organic additive to form, in the fluid, micelles containing carbon dioxide in a supercritical or a subcritical state.

11. The etching method according to claim 5, further comprising forming the catalyst layer on the semiconductor structure.

12. An article manufacturing method comprising etching the semiconductor structure by the etching method according to claim 5.

13. The article manufacturing method according to claim 12, wherein the organic additive is a surfactant.

14. The article manufacturing method according to claim 12, further comprising allowing the organic additive to form, in the fluid, micelles containing carbon dioxide in a supercritical or a subcritical state.

15. A semiconductor device manufacturing method comprising etching a semiconductor substrate by the etching method according to claim 5.

16. The semiconductor device manufacturing method according to claim 15, wherein the organic additive is a surfactant.

17. The semiconductor device manufacturing method according to claim 15, further comprising allowing the organic additive to form, in the fluid, micelles containing carbon dioxide in a supercritical or a subcritical state.

18. A semiconductor chip manufacturing method comprising singulating a semiconductor substrate into semiconductor chips by the etching method according to claim 5.

19. The semiconductor chip manufacturing method according to claim 18, wherein the organic additive is a surfactant.

20. The semiconductor chip manufacturing method according to claim 18, further comprising allowing the organic additive to form, in the fluid, micelles containing carbon dioxide in a supercritical or a subcritical state.

* * * * *